United States Patent

Yeh

[11] Patent Number: 6,130,166
[45] Date of Patent: Oct. 10, 2000

[54] ALTERNATIVE PLASMA CHEMISTRY FOR ENHANCED PHOTORESIST REMOVAL

[75] Inventor: Edward Yeh, San Jose, Calif.

[73] Assignee: VLSI Technology, Inc., San Jose, Calif.

[21] Appl. No.: 09/241,270

[22] Filed: Feb. 1, 1999

[51] Int. Cl.$^7$ ................................................. H01L 21/311
[52] U.S. Cl. ............................................. 438/710; 438/725
[58] Field of Search ...................................... 438/725, 723, 438/643, 704, 699, 720, 637

[56] References Cited

U.S. PATENT DOCUMENTS

| | | | |
|---|---|---|---|
| 5,356,478 | 10/1994 | Chen et al. | 134/1 |
| 5,647,953 | 7/1997 | Williams et al. | 156/643 |
| 5,851,302 | 12/1998 | Solis | 438/723 |
| 5,925,577 | 7/1999 | Solis | 438/725 |

OTHER PUBLICATIONS

Fujimura, S. et al., "Resist Stripping in an $O_2 + H_2O$ Plasma Downstream," J. Vac. Sci. Technol. B, 9(2), pp. 357–361 (1991).

Sakugawa, H. et al. "Atmospheric Hydrogen Peroxide," Environ. Sci Technol., 24(10), pp. 1452, 1462 (1990).

Primary Examiner—David Nelms
Assistant Examiner—Dung A Le
Attorney, Agent, or Firm—Douglas L. Weller

[57] ABSTRACT

A $CF_4/H_2O_2$ plasma is used to remove residues remaining after an ashing step. On a substrate, a layer of photoresist is formed over an underlying layer. The layer of photoresist is developed to form a photoresist pattern. The underlying layer is etched using the photoresist pattern. The substrate, including exposed areas of the underlying layer, are subjected to a plasma comprising $H_2O_2$ vapor and a gaseous fluorocarbon to remove residual polymers.

19 Claims, 5 Drawing Sheets

ALTERNATIVE PLASMA CHEMISTRY FOR ENHANCED PHOTORESIST REMOVAL

RELATED APPLICATIONS

This subject matter of the present application is related to the following co-pending patent applications, which each have different inventive entities than, but are commonly owned with, the present application: Ser. No. 08/803,180, filed Feb. 19, 1997; Ser. No. 08/943,891, filed Oct. 3, 1997; Ser. No. 08/877,095, filed Jun. 17, 1997; and Ser. No. 09/042,605, filed Mar. 16, 1998.

BACKGROUND

The present invention concerns the fabrication of integrated circuits and pertains particularly to the removal of photoresist.

In fabricating integrated circuits, after the use of photoresist from a photolithography or etch step, the photoresist (or resist) must be removed for the subsequent steps. Resist must be removed following a wide variety of processing steps, including dry etching, wet etching, ion implantation, lift-off processes, high temperature postbake and the removal of misaligned resist patterns for reimaging after development and inspection ("rework"). In addition, wafer surface patterns of several different materials may be present under the resist. Typical materials include silicon dioxide ($SiO_2$), aluminum, polysilicon, silicides and polyimide. It is important when stripping resist to ensure that all the photoresist is removed as quickly as possible without attacking any underlying surface materials.

In the prior art, complete removal of polymers generated during etch of high aspect ratio via holes has proved difficult. The etching processes required to control via sidewall profiles and maintain high selectivity to mask and substrate leave polymers that are very difficult to remove. Residual polymers that are not removed will result in vias having higher resistances. These polymers are typically composed of both organic and inorganic components and may require both dry and wet stripping to achieve complete removal. The more difficult the polymer is to remove, the more aggressive the solvent stripper must be, with consequences in safety, cost, and manageability. The burden of strippability can be lessened by making the postetch ash more effective in creating a soluble polymer, and by increasing the dry etch selectivity to the substrate material. Residual polymers also need to be removed in other applications after photoresist etch.

It has been shown that the OH radicals produced by a plasma reduce the activation energy for resist removal. See Fujimura, S. et al., "Resist Stripping in an $O_2+H_2O$ Plasma Downstream," J. Vac. Sci. Technol. B, 9(2), PP. 357–361 (1991). See also U.S. Pat. No. 5,814,155 issued on Sep. 29, 1998 to Mark A. Levan and Ramiro Solis for PLASMA ASHING ENHANCEMENT.

SUMMARY OF THE INVENTION

In accordance with the preferred embodiment of the present invention, a $CF_4/H_2O_2$ plasma is used to remove residues remaining after an ashing step. On a substrate, a layer of photoresist is formed over an underlying layer. The layer of photoresist is developed to form a photoresist pattern. The underlying layer is etched using the photoresist as a pattern. The substrate, including exposed areas of the underlying layer, are subjected to a plasma comprising $H_2O_2$ vapor and a gaseous fluorocarbon to remove residual polymers.

For example, in the preferred embodiment the gaseous fluorocarbon is $CF_4$. The $CF_4$ is introduced into an ashing environment. $H_2O_2$ vapor is also introduced into the ashing environment.

In one embodiment of the present invention, the residues are removed as part of a process for forming an isolation structure on an integrated circuit using shallow trench isolation. A nitride mask is formed to define a trench area on a substrate of the integrated circuit. The substrate including the trench area are subjected to a plasma comprising $H_2O_2$ vapor, and one of a gaseous fluorocarbon or a fluorinated hydrocarbon gas to clean impurities on the trench area. The substrate is etched to form a trench within the trench area.

In another embodiment of the present invention, the residues are removed as part of a process for forming a via contact hole in a semiconductor device. A metal layer is formed on a wafer. A dielectric layer is formed on the metal layer. A photoresist layer is formed on the dielectric layer. The photoresist layer is patterned. A via contact hole is formed by an etching process that uses the photoresist as a pattern. The substrate is subjected to a plasma comprising $H_2O_2$ vapor and a gaseous fluorocarbon to remove residual polymers.

The present invention provides for efficient removal of all residues remaining after an ashing step.

DESCRIPTION OF THE PREFERRED EMBODIMENT

A $CF_4/H_2O_2$ plasma is used to remove all residues remaining after an ashing step. The presence of $CF_4$ helps to remove all residues remaining from the ashing step. However, $CF_4$ also attacks other films. The presence of $H_2O_2$ prevents this attack, but still allows efficient removal of residues.

In the preferred embodiment of the present invention, when removing residues after forming a photoresist pattern, $H_2O_2$ is used as an additive to a $CF_4/H_2O$ plasma or as a replacement for $H_2O$. Since the structure of $H_2O_2$ is composed of two joined OH radicals, it is potentially a greater source of OH radicals than $H_2O$ which can only produce one OH radical. A plasma that has OH radicals will ash faster (or at a lower temperature) than one consisting entirely of O radicals. Water vapor produces OH in a plasma, but it is not as efficient a source of OH as is $H_2O_2$.

$H_2O_2$ can be photolytically dissociated, especially by ultraviolet light, which is in abundance in a plasma reaction, i.e., a single molecule of $H_2O_2$ when exposed to ultraviolet light produces two molecules of OH. For further information on $H_2O_2$, see Sakugawa, H. et al. "Atmospheric Hydrogen Peroxide," Environ. Sci Technol., 24(10), pp. 1452, 1462 (1990).

$H_2O_2$ can be used in the same hardware that $H_2O$ is used in, with an adjustment to the temperature controls for $H_2O_2$'s higher boiling point of 150° C., as compared with 100° C. for $H_2O$.

For example, photoresist is patterned as part of a process to form a via contact hole. This is illustrated by FIGS. 1, 2 and 3.

Figure 1:
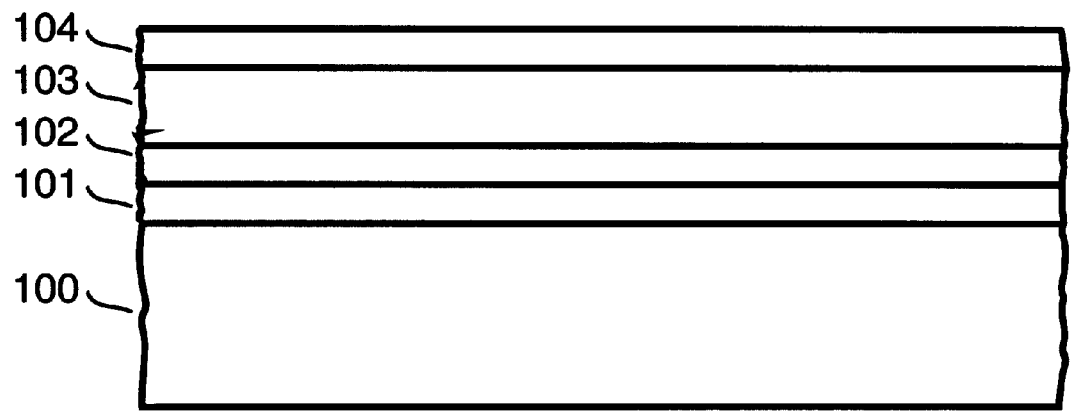
FIG. 1, FIG. 2 and FIG. 3 illustrate a process to form a via in which sidewall residues are removed in accordance with a preferred embodiment of the present invention.

FIG. 1 shows a semiconductor device substrate 100 on which a dielectric layer 101 has been deposited. A metal line composed of a first metal layer 102, second metal layer 103, and third metal layer 104 is formed on the dielectric layer.

Figure 2:
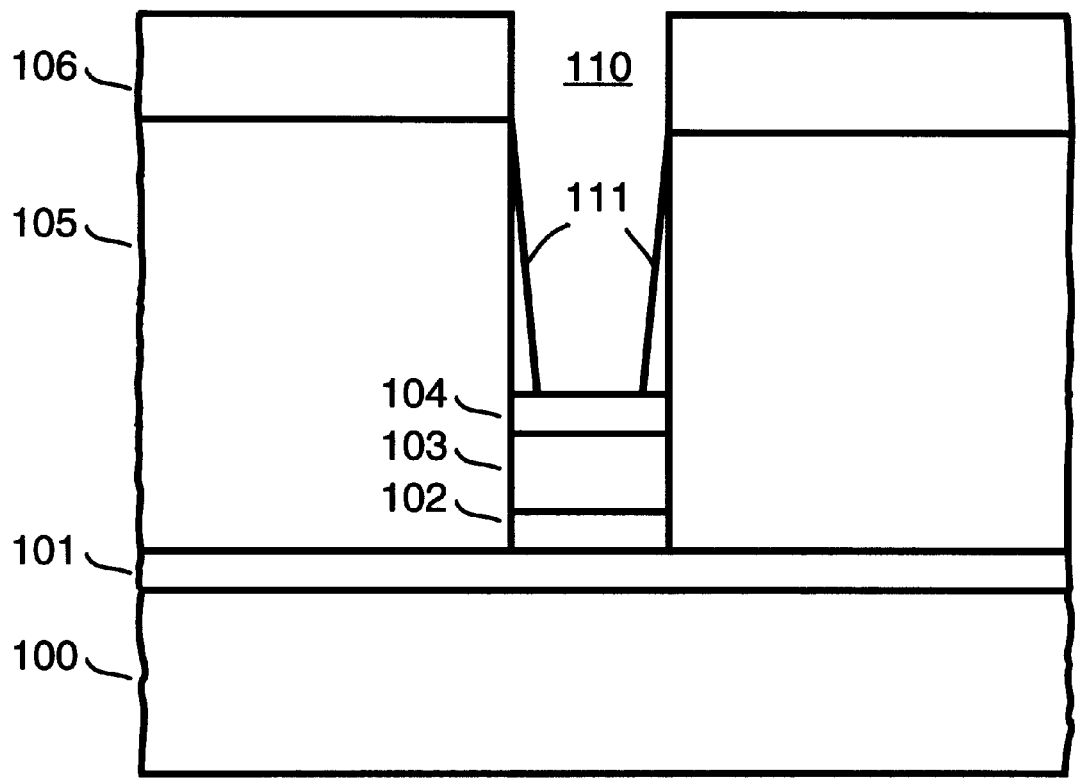
Figure 3:
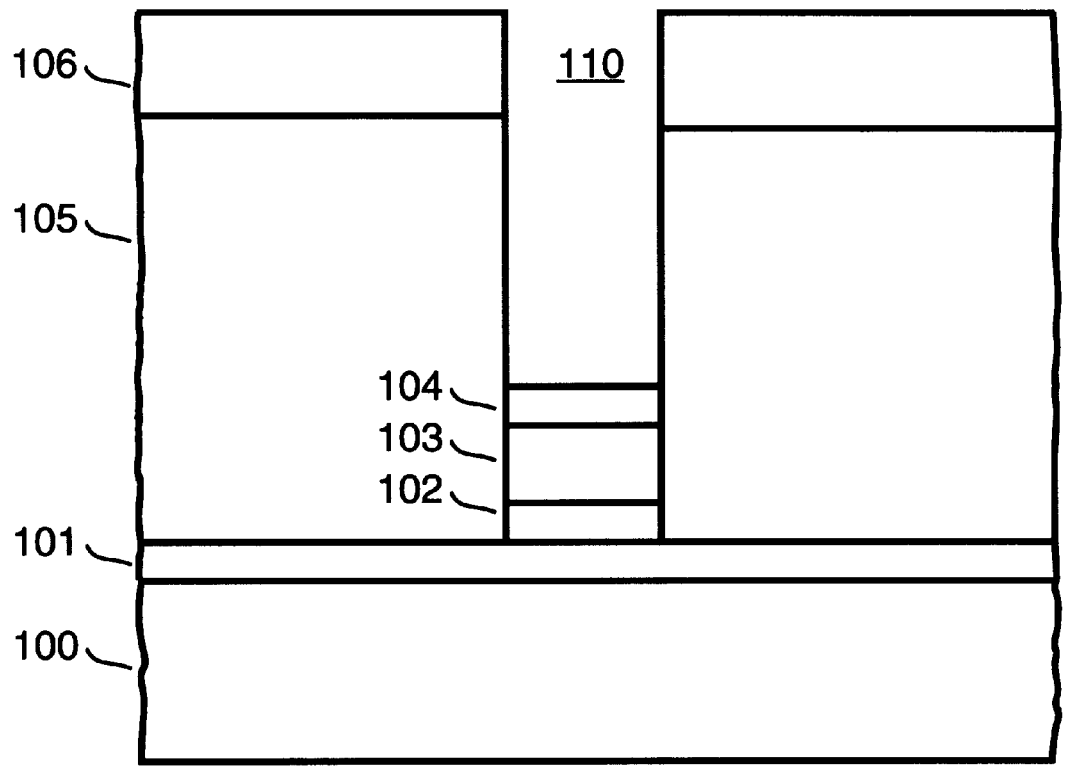

FIG. 2 shows the semiconductor device following etching of metal layers 102, 103 and 104, deposition of a dielectric layer 105 over the semiconductor substrate, planarization, coating the device with photoresist 106, formation of a mask pattern and etching a via contact hole 110.

In etching processes used for forming the via contact hole, the polymer layer 111 on the sidewall of the photoresist layer and on the sidewall of the via contact hole is formed by the reaction of the photoresist layer, dielectric layer, and metal layers.

FIG. 3 shows the semiconductor device after selective removal of the sidewall polymer 111 so that third metal layer 104 is not etched. Resist and sidewall polymer 111 are removed using a $CF_4$ and $H_2O_2$ plasma as the etch gas. To achieve the highest selectivity with respect to the third metal layer 104 it is preferable for the ratio of $H_2O_2$ to $CF_4$ flow rates into the reactive chamber to be about 1.67 to 1.

In one embodiment, $H_2O_2$ and $CF_4$ are introduced into an ashing environment to form an inductively coupled plasma. For example, $H_2O_2$ is introduced at a temperature of 70° C. and at a flow rate of approximately 600 standard cubic centimeters per minute (SCCM). $CF_4$ is introduced at a flow rate of approximately 360 SCCM. Alternatively, in another embodiment of the present invention, oxygenated gases such as $O_2$, $H_2O$, gaseous polyfluorocarbons such as $C_2F_6$, or fluorinated hydrocarbons such as $CHF_3$, instead of or in addition to $CF_4$, are introduced into the ashing environment at a flow rate of approximately 300 SCCM. Alternatively, other flow rates may be used to introduce the gases into the ashing environment. Also, other plasma sources such as microwave, can be used in place of the inductively coupled plasma.

Depending on the application, other methods can be used to generate an $H_2O_2$ and $CF_4$ plasma for use in removing photoresist. For example, an ion beam method may be used where the $H_2O_2$ and $CF_4$ plasma is generated in a separate chamber and ions are accelerated towards the substrate surface by means of grids. Alternatively, a method may be used where the $H_2O_2$ and $CF_4$ plasma is generated in a separate chamber away from the substrate to be etched. In this case mainly neutral active species and only very few ions are directed onto the substrate surface by means of the combination of differential pressure and/or magnetic fields.

Figure 4:
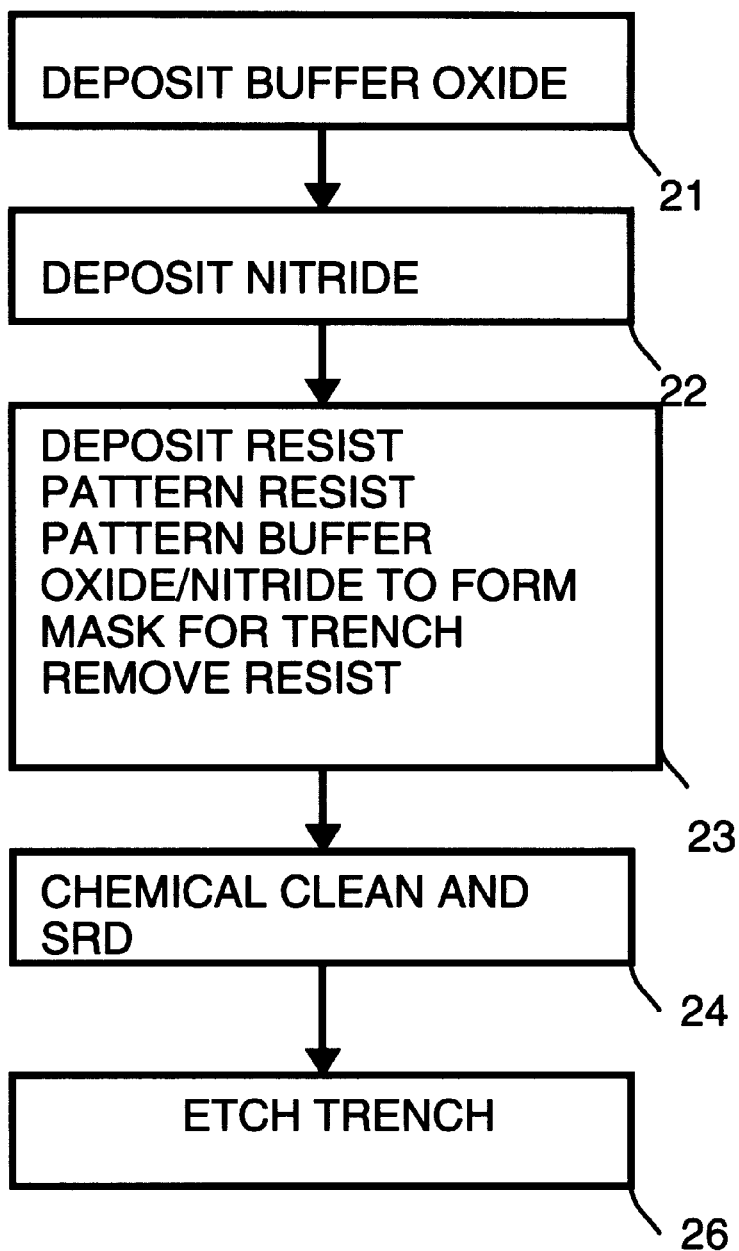
FIG. 4 is a flowchart for a shallow trench isolation process in accordance with a preferred embodiment of the present invention.

In alternative embodiments, the $H_2O_2$ and $CF_4$ plasma can be used in removing polymer remnants after photoresist etch in other processing applications. For example, FIG. 4 is a flowchart for a shallow trench isolation process in accordance with a preferred embodiment of the present invention. In step 21, a layer of buffer (pad) oxide is formed on a substrate of a semiconductor wafer. For example, the layer of buffer oxide is formed by thermal oxidation of silicon to grow the oxide. The layer of buffer oxide is, for example, 200 Angstroms (Å) thick. In a step 22, a layer of nitride is formed on top of the layer of buffer oxide. For example, the layer of nitride is formed by low pressure chemical vapor deposition (LPCVD, $SiH_2Cl_2+NH_3$. Dichlorosilane/Ammonia). The layer of nitride is, for example, 2000 Å thick.

In a step 23, a layer or resist is deposited and then patterned. The nitride and buffer oxide is then patterned to define a trench area. The resist is then removed.

At this point, a special cleaning optionally can be performed. For example, the semiconductor wafer is placed in an ashing environment such as, for example, an inductively coupled plasma. Although such an ashing environment is used in the present embodiment, the present invention is also well suited to the use of various other well known ashing environments. In one embodiment, the ashing environment operates at a pressure of approximately 1.2 Torr and a power of approximately 900 Watts. $H_2O_2$ and $CF_4$ are then introduced into the ashing environment to form an inductively coupled plasma. For example, $H_2O_2$ is introduced at a flow rate of approximately 600 standard cubic centimeters per minute (SCCM). $CF_4$ is introduced at a flow rate of approximately 360 SCCM. Alternatively, in another embodiment of the present invention, oxygenated gases such as $O_2$ or $H_2O$, gaseous polyfluorocarbons such as $C_2F_6$, or fluorinated hydrocarbons such as $CHF_3$, instead of $CF_4$, are introduced into the ashing environment at a flow rate of approximately 300 SCCM. Alternatively, other flow rates may be used to introduce the gases into the ashing environment. Also, other plasma sources such as microwave, can be used in place of the inductively coupled plasma.

For example, in one embodiment of the present invention, the ashing environment comprising $H_2O_2$ vapor and the gaseous fluorocarbon or a fluorinated hydrocarbon gas, efficiently and thoroughly removes water spots or polymer contaminants introduced over the trench area.

In a step 24, a conventional clean of the trench area is performed. The clean is performed, for example, with wet chemicals such as sulfuric acid and hydrogen peroxide. The clean typically ends with a spin-rinse-dry (SRD).

Figure 5:
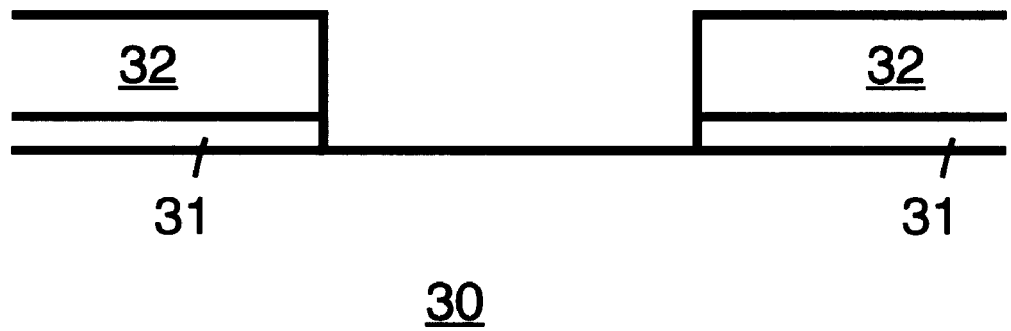
FIG. 5 and FIG. 6 illustrate the shallow trench isolation process described in FIG. 4 in accordance with a preferred embodiment of the present invention.

FIG. 5 illustrates the result of the completion of step 24. In FIG. 5, on top of a silicon substrate 30, sections 32 of a nitride layer are over sections of a buffer oxide layer 31. The trench area is clean.

Figure 6:
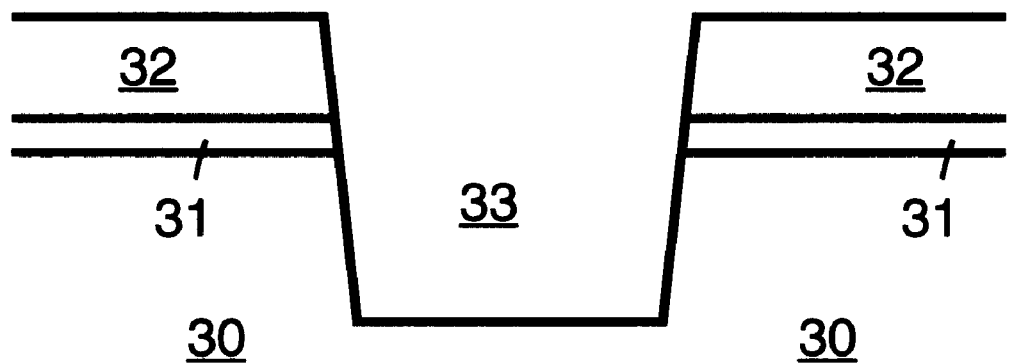

In a step 26, a trench is formed by, for example performing a dry etch of the silicon wafer. The dry etch can be one or more steps to etch the silicon and smooth out the sidewall profile. FIG. 6 illustrates the result of the completion of step 26. In FIG. 6, a trench 33 is shown etched in silicon substrate 30. For example, trench 33 is 0.5 microns wide and extends 0.4 microns below the surface of substrate 30. The substrate is etched to form a trench within the trench area.

At this point, a special cleaning can again be performed. For example, the semiconductor wafer is placed in an ashing environment such as, for example, an inductively coupled plasma. Although such an ashing environment is used in the present embodiment, the present invention is also well suited to the use of various other well known ashing environments. In one embodiment, the ashing environment operates at a pressure of approximately 1.2 Torr and a power of approximately 900 Watts. $H_2O_2$ and $CF_4$ are then introduced into the ashing environment to form an inductively coupled plasma. For example, $H_2O_2$ is introduced at a flow rate of approximately 600 standard cubic centimeters per minute (SCCM). $CF_4$ is introduced at a flow rate of approximately 360 SC CM. Alternatively, in another embodiment of the present invention, oxygenated gases such as $O_2$ or $H_2O$, gaseous polyfluorocarbons such as $C_2F_6$, or fluorinated hydrocarbons such as $CHF_3$, instead of $CF_4$, are introduced into the ashing environment at a flow rate of approximately 300 SCCM. Alternatively, other flow rates may be used to introduce the gases into the ashing environment. Also, other plasma sources such as microwave, can be used in place of the inductively coupled plasma.

For example, in one embodiment of the present invention, the ashing environment comprising $H_2O_2$ vapor and the gaseous fluorocarbon or a fluorinated hydrocarbon gas, efficiently and thoroughly removes water spots or polymer contaminants within the trench.

The foregoing discussion discloses and describes merely exemplary methods and embodiments of the present invention. As will be understood by those familiar with the art, the invention may be embodied in other specific forms without departing from the spirit or essential characteristics thereof. Accordingly, the disclosure of the present invention is intended to be illustrative, but not limiting, of the scope of the invention, which is set forth in the following claims.

I claim:

1. A method for use when processing integrated circuitry comprising the following steps:
    (a) on a substrate, forming a layer of photoresist over an underlying layer;
    (b) developing the layer of photoresist to form a photoresist pattern;
    (c) etching the underlying layer using the photoresist pattern; and,
    (d) subjecting the substrate including exposed portions of the underlying layer to a plasma comprising hydrogen peroxide ($H_2O_2$) vapor and a gaseous fluorocarbon to remove residual polymers.

2. A method as in claim 1 wherein step (d) comprises the steps of:
    (d.1) introducing $CF_4$ into an ashing environment; and,
    (d.2) introducing $H_2O_2$ vapor into the ashing environment.

3. A method as in claim 1, wherein in step (d) the gaseous fluorocarbon is $CF_4$.

4. A method as in claim 1, wherein in step (d) the plasma comprises another oxygenated species in addition to $H_2O_2$ vapor.

5. A method as in claim 4, wherein in step (d) the other oxygenated species is $O_2$.

6. A method as in claim 4 wherein in step (d), the other oxygenated species is $H_2O$.

7. A method as in claim 1, wherein in step (d) the plasma does not include significant amounts of an oxygenated species in addition to $H_2O_2$ vapor.

8. A method for forming an isolation structure on an integrated circuit using shallow trench isolation comprising the following steps:
    (a) forming a nitride mask to define a trench area on a substrate of the integrated circuit;
    (b) subjecting the substrate including the trench area to a plasma comprising hydrogen peroxide ($H_2O_2$) vapor, and one of a gaseous fluorocarbon or a fluorinated hydrocarbon gas to clean impurities on the trench area; and,
    (c) etching the substrate to form a trench within the trench area.

9. A method as in claim 8, wherein in step (b) the gaseous fluorocarbon is $CF_4$.

10. A method as in claim 8, wherein in step (b) the plasma comprises another oxygenated species in addition to $H_2O_2$ vapor.

11. A method as in claim 10, wherein in step (b) the other oxygenated species is $O_2$.

12. A method as in claim 10, wherein in step (b), the other oxygenated species is $H_2O$.

13. A method as in claim 8 additionally comprising the following step:
    (d) subjecting the trench to a plasma comprising $H_2O_2$ vapor, and one of a gaseous fluorocarbon or a fluorinated hydrocarbon gas to clean impurities within the trench.

14. A method for forming a via contact hole in a semiconductor device comprising the following steps:
    (a) forming a metal layer on a wafer;
    (b) forming a dielectric layer on the metal layer;
    (c) forming a photoresist layer on the dielectric layer;
    (d) patterning the photoresist layer;
    (e) forming a via contact hole by an etching process which uses the photoresist as a pattern; and,
    (f) subjecting the substrate to a plasma comprising hydrogen peroxide ($H_2O_2$) vapor and a gaseous fluorocarbon to remove residual polymers.

15. A method as in claim 14 wherein step (f) comprises the steps of:
    (f.1) introducing $CF_4$ into an ashing environment; and,
    (f.2) introducing $H_2O_2$ vapor into the ashing environment.

16. A method as in claim 14, wherein in step (f) the gaseous fluorocarbon is $CF_4$.

17. A method as in claim 14, wherein in step (f) the plasma comprises another oxygenated species in addition to $H_2O_2$ vapor.

18. A method as in claim 17, wherein in step (f), the other oxygenated species includes one of the following: $O_2$, $H_2O$.

19. A method as in claim 14, wherein in step (f) the plasma does not include significant amounts of an oxygenated species in addition to $H_2O_2$ vapor.

* * * * *